(12) United States Patent
Grove et al.

(10) Patent No.: US 11,990,388 B2
(45) Date of Patent: May 21, 2024

(54) PUMP-MOTOR ASSEMBLY FOR AN ENERGY STORAGE SYSTEM

(71) Applicant: Caterpillar Inc., Peoria, IL (US)

(72) Inventors: Adam C. Grove, Washington, IL (US); Nirag Sheth, Peoria, IL (US); Umakanth Sakaray, Dunlap, IL (US); John M. Tanner, Dunlap, IL (US); Jeremy Byrd, West Lafayette, IN (US); Gregory S. Hasler, Pekin, IL (US)

(73) Assignee: Caterpillar Inc., Peoria, IL (US)

( * ) Notice: Subject to any disclaimer, the term of this patent is extended or adjusted under 35 U.S.C. 154(b) by 959 days.

(21) Appl. No.: 16/987,256

(22) Filed: Aug. 6, 2020

(65) Prior Publication Data

US 2022/0044985 A1 Feb. 10, 2022

(51) Int. Cl.
*H01L 23/473* (2006.01)
*F24F 1/0323* (2019.01)
*F25D 19/00* (2006.01)
*F28D 15/02* (2006.01)

(52) U.S. Cl.
CPC ........ *H01L 23/473* (2013.01); *F28D 15/0266* (2013.01); *F24F 1/0323* (2019.02); *F25D 19/003* (2013.01)

(58) Field of Classification Search
CPC ..... H01L 23/473; F25D 19/003; Y02E 60/10; H01M 10/613; H01M 10/627; H01M 10/6568
See application file for complete search history.

(56) References Cited

U.S. PATENT DOCUMENTS

| | | | |
|---|---|---|---|
| 7,738,251 B2 | 6/2010 | Clidaras et al. | |
| 8,593,102 B2 | 11/2013 | McGuire et al. | |
| 8,685,238 B2 * | 4/2014 | Gunter | C02F 1/325 422/186 |
| 10,522,801 B2 | 12/2019 | Kronke et al. | |
| 2015/0191072 A1 * | 7/2015 | Inoue | B60L 15/20 62/428 |
| 2019/0046820 A1 | 2/2019 | Lee et al. | |
| 2019/0097280 A1 | 3/2019 | You et al. | |
| 2021/0143499 A1 * | 5/2021 | Sprague | H01M 50/213 |

FOREIGN PATENT DOCUMENTS

JP 2015191717 A 11/2015

* cited by examiner

*Primary Examiner* — Lionel Nouketcha
(74) *Attorney, Agent, or Firm* — Bookoff McAndrews PLLC

(57) ABSTRACT

In one aspect, a pump-motor assembly is provided outside of and adjacent to a storage container that stores a back-up energy storage unit. The pump-motor assembly includes a pump-motor that maintains a minimum pressure of a liquid coolant in a liquid coolant system that cools the back-up energy storage unit, and a housing that is completely enclosed, the housing containing the pump-motor, and having a removable access panel on one side thereof the enclosed structure, and an opening on another side thereof to the storage container.

20 Claims, 4 Drawing Sheets

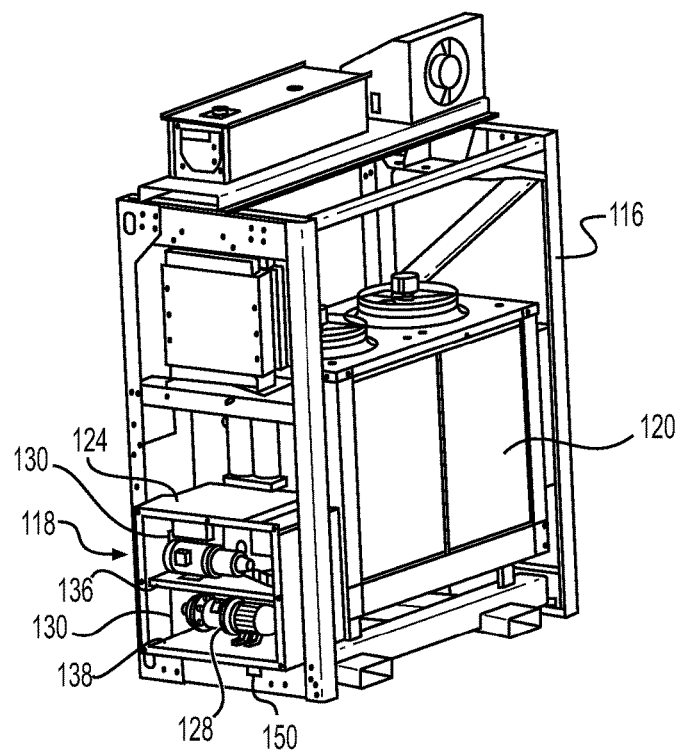
FIG. 5
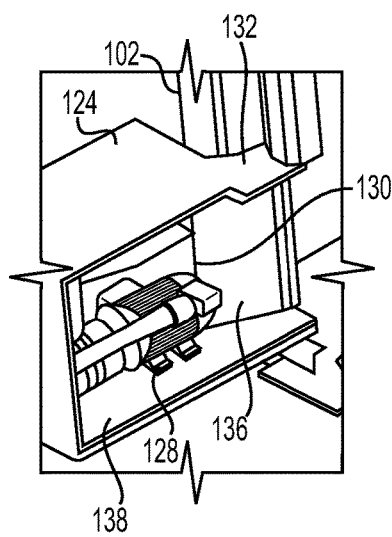   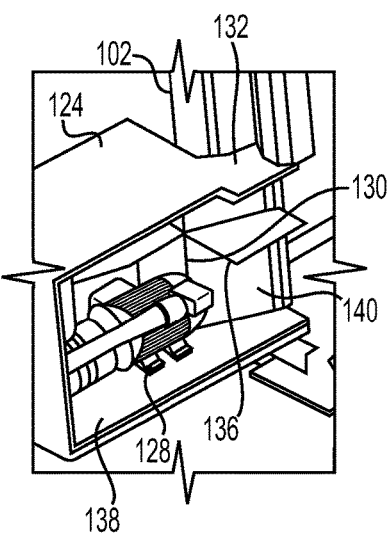   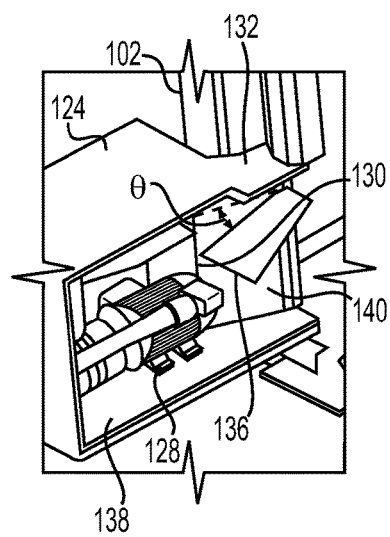
FIG. 6        FIG. 7        FIG. 8

PUMP-MOTOR ASSEMBLY FOR AN ENERGY STORAGE SYSTEM

TECHNICAL FIELD

The present disclosure relates generally to a pump-motor assembly for an energy storage system, and, more particularly, to a pump-motor assembly for a cooling system used to cool a back-up energy storage system.

BACKGROUND

Diesel fuel is typically used to power land drilling rigs, but natural gas is an attractive alternative option due to lower emissions, lower cost, and widespread availability of natural gas produced at drilling sites. Unlike diesel powered generator sets (gensets), however, transient response of a natural gas genset is inadequate to accept large load changes on a drill rig, unless combined with an energy storage system. A back-up energy source, made of, for example, lithium ion batteries, is used to supplement power supplied to the drill rig when natural gas engines are unable to accept the load. The back-up energy source is designed to operate within a specific temperature range and, therefore, may need to be cooled intermittently, as excess heat can degrade performance, safety, and operating life of the back-up energy source.

Electric motor driven pumps are used in back-up energy storage systems to circulate a coolant to cool the back-up energy sources, such as batteries, and power electronics equipment. For example, in energy storage systems that include liquid cooled lithium ion batteries, a temperature of the batteries must be maintained with a range of 20° C. to 30° C. to achieve optimal performance and life of the batteries. The electric pump-motors are used to circulate the coolant through channels around the batteries to thermally manage the batteries. Pump-motors have a high cost of installation. In addition, pump-motors may be required to operate across a broad range of ambient temperatures, e.g., −40° C. to 50° C., and require thermal management, e.g., heating, ventilation, and air conditioning (HVAC), as heat is generated during use.

Open drip proof (ODP) pumps or totally enclosed fan cooling (TEFC) pumps may be used, as well as other higher-level sealing options for heat and contamination management of the pumps. In high ambient conditions, however, use of an ODP pump may result in condensation. If a TEFC pump is used, proper heat management is required. And, in low ambient conditions, e.g., −40° C., arctic duty pumps, which are high in cost, are required if exposed to low ambient temperatures. If an outdoor pump is used, heater strips may be used to provide heat to pump-motors in low ambient conditions, but these require an additional power source and a control system, and must be powered on as part of a start-up procedure. Outdoor pumps also require protection from debris, snow accumulation, or sand penetration under windy conditions, in order to maintain reliable operation, while also being accessible for proper maintenance and service. Enclosures can be costly, and pump components having increased durability may be required. In high ambient conditions, condensate can form on windings of a motor due to cold coolant flowing through the pump. Condensation can damage the windings to the point of rendering the motor inoperable. An enclosure, sealed from ambient air to prevent condensation, may lead to overheating if not ventilated properly.

The pump-motor assembly according to the present disclosure may solve one or more of the problems set forth above and/or other problems in the art. The scope of the current disclosure, however, is defined by the attached claims, and not by the ability to solve any specific problem.

SUMMARY

In one aspect, a pump-motor assembly is provided outside of and adjacent to a storage container that stores a back-up energy storage unit, and includes a pump-motor that maintains a minimum pressure of a liquid coolant in a liquid coolant system that cools the back-up energy storage unit, and a housing that is completely enclosed. The housing contains the pump-motor, and has a removable access panel on one side thereof the enclosed structure, and an opening on another side thereof to the storage container.

In another aspect, an energy storage system includes a storage container that stores a back-up energy storage unit, including one or more energy sources, a heating, ventilation, and air conditioning (HVAC) unit provided in the storage container to cool air in the storage container, a liquid cooling system that cools the back-up energy storage unit, and a pump-motor assembly provided outside of the storage container. The pump-motor assembly includes a pump-motor that circulates a liquid coolant in the liquid coolant system at a minimum pressure, and a housing that is completely enclosed, the housing containing the pump-motor, and having an opening on one side thereof that connects to an opening in the storage container.

In still another aspect, an energy storage system includes a back-up energy storage unit, including one or more energy sources, a storage container that stores the back-up energy storage unit, and a heating, ventilation, and air conditioning (HVAC) unit that cools air in the storage container. The energy storage system also includes a liquid cooling system that cools the one or more energy sources of the back-up energy storage unit, a pump-motor provided outside of the storage container, the pump-motor assembly being connected to the liquid cooling system and maintaining a minimum pressure of a liquid coolant in the liquid coolant system, and a housing containing the pump-motor, the housing being sealed from ambient air, and having a removable access panel on one side thereof the enclosed structure, and an opening on another side thereof that connects to an opening in the storage container. Cool air from the storage container flows into the housing, and hot air from the housing flows into the storage container.

BRIEF DESCRIPTION OF THE DRAWINGS

FIG. 5 shows a schematic view of the storage rack, including the pump-motor assembly shown in FIGS. 1 and 3, with an access panel removed;

FIG. 6 shows a cutaway view of the pump-motor assembly shown in FIGS. 1, 3, and 5, including a baseline baffle;

FIG. 7 shows a cutaway view of the pump-motor assembly shown in FIGS. 1, 3, and 5, including a horizontal baffle;

FIG. 8 shows a cutaway view of the pump-motor assembly shown in FIGS. 1, 3, and 5, including an inclined baffle.

DETAILED DESCRIPTION

Both the foregoing general description and the following detailed description are exemplary and explanatory only and are not restrictive of the features, as claimed. As used herein, the terms "comprises," "comprising," "having," including," or other variations thereof, are intended to cover a non-exclusive inclusion, such that a process, method, article, or apparatus that comprises a list of elements does not include only those elements, but may include other elements not expressly listed or inherent to such a process, method, article, or apparatus. In addition, in this disclosure, relative terms, such as, for example, "about," "generally, "substantially," and "approximately" are used to indicate a possible variation of ±10% in the stated value.

Figure 1:
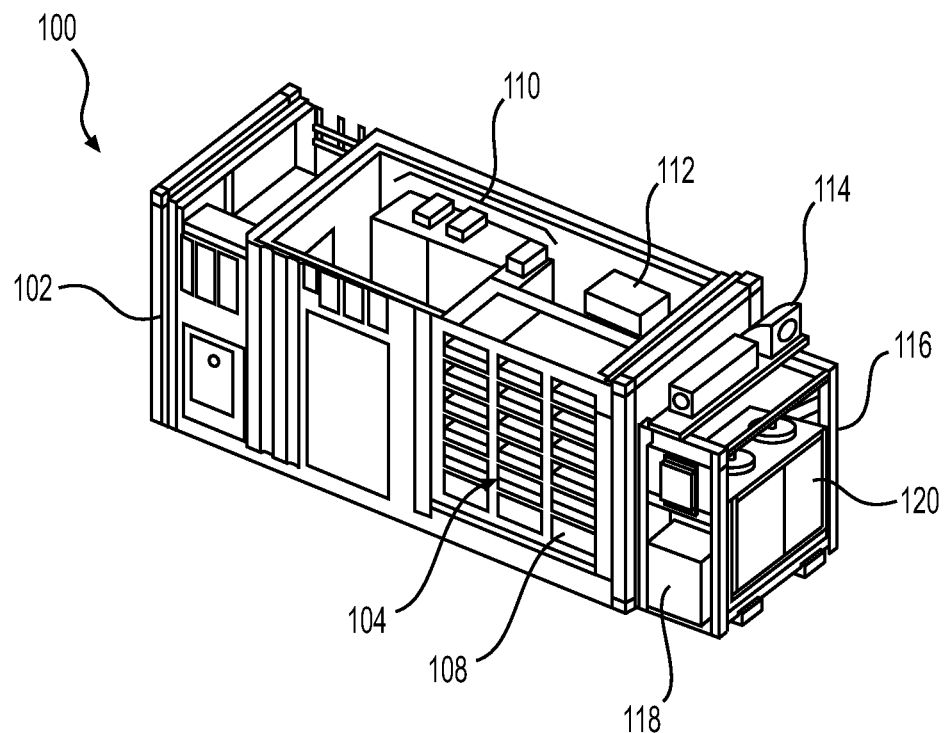
FIG. 1 shows a schematic view of a storage system including a storage container and a pump-motor assembly, in accordance with the present disclosure.
Figure 2:
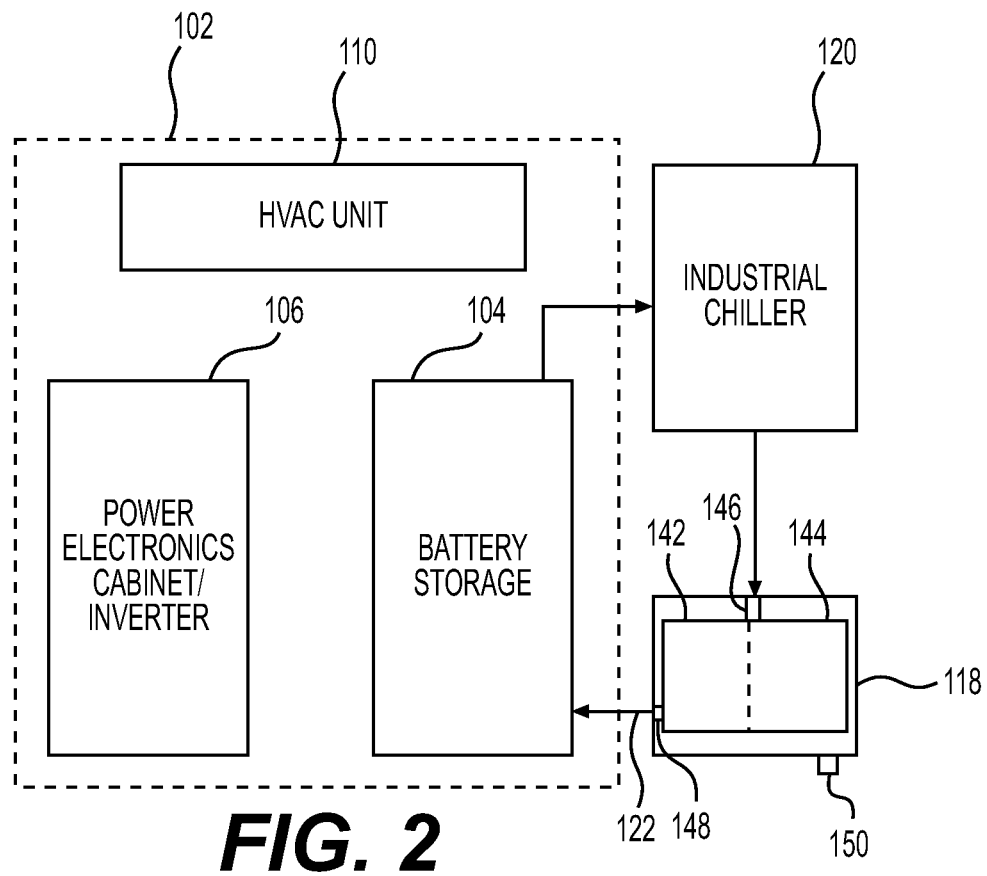
FIG. 2 shows a schematic diagram of a cooling system for a back-up energy storage system within the storage container.

FIG. 1 shows a schematic view of a battery storage system 100 having a storage container 102, battery storage 104, or a back-up energy storage unit, and a power electronics cabinet 106 contained therein. The battery storage 104 may contain energy storage units, for example, lithium ion batteries 108, as a back-up energy source. The power electronics cabinet 106 may contain, for example, an inverter that converts direct current (DC) power to alternating current (AC) power, and vice versa. The storage container 102 may be insulated, and may be cooled by a heating, ventilation, and air conditioning (HVAC) unit 110. The HVAC unit 110 may include, for example, an evaporator 112 located within the storage container 102, and a condenser 114 located outside of the storage container. The power electronics cabinet 106 is cooled by the HVAC unit 110 by virtue of being located in the storage container 102. A storage rack 116 is located adjacent to one end of the storage container 102, on an exterior thereof. The storage rack 116 houses and supports, among other features, a pump-motor assembly 118, and a chiller 120. The chiller 120 may be an industrial refrigerated chiller that cools a liquid coolant, described below, using a refrigerant. FIG. 2 shows a schematic arrangement of the battery storage 104, the HVAC unit 110, the pump-motor assembly 118, and the chiller 120. A liquid cooling system 122 is provided with connections between the pump-motor assembly 118, the battery storage 104, and the chiller 120. A liquid coolant flows through the liquid cooling system 122 to cool the battery storage 104.

Figure 3:
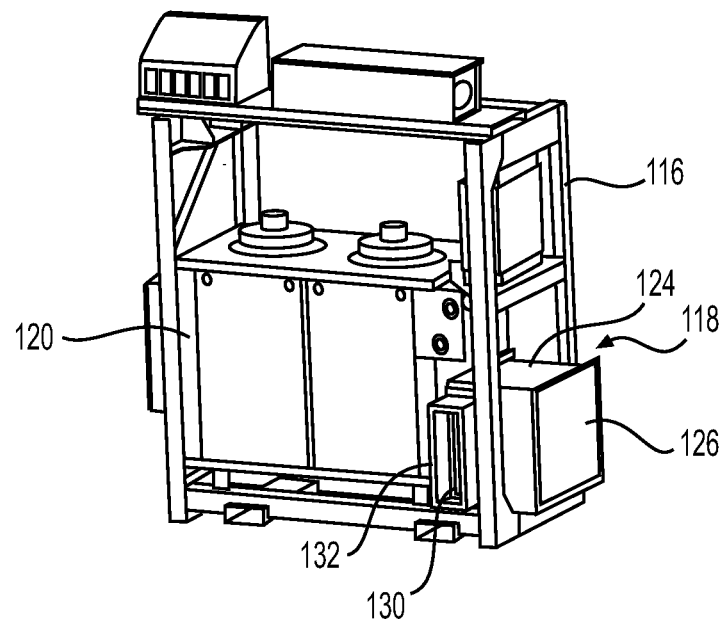
FIG. 3 shows a schematic view of a storage rack that stores the pump-motor assembly shown in FIG. 1.

As shown in FIG. 3, the pump-motor assembly 118 is mounted on the storage rack 116 outside of the storage container 102. The storage rack 116 may have other components mounted thereon, including the chiller 120. The pump-motor assembly 118 includes a housing 124 in the form of an enclosed structure. The housing 124 may be completely enclosed, e.g., sealed from ambient air, or hermetically sealed. The housing 124 is a box having six sides, and may be formed of, for example, stainless steel. The housing 124 may, however, be formed of other materials. The housing 124 includes an access panel 126 on one side thereof. The access panel 126 may be removed to access a pump-motor 128 of the pump-motor assembly 118, shown in FIG. 5, and described in more detail below, for maintenance and servicing. When the access panel 126 is attached to the housing 124, the housing 124 forms an enclosed structure. The housing 124 may be insulated. For example, the housing 124 may include a layer of insulation (not shown) of about 25 mm thickness, around a perimeter of inner surfaces thereof.

Figure 4:
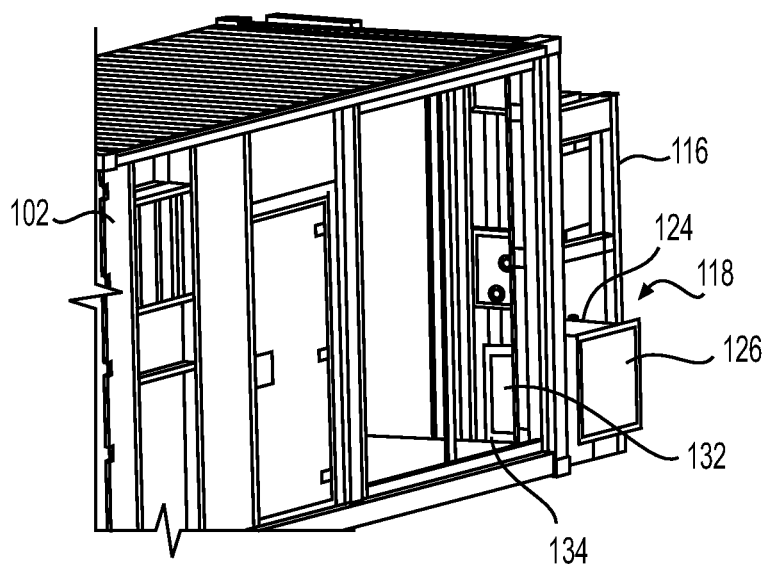
FIG. 4 shows a schematic view of the energy storage container and an opening that connects the energy storage container to the pump-motor assembly shown in FIGS. 1 and 3.

With reference to FIG. 3, the housing 124 also has an opening 130 on a side of the housing 124 that faces the storage container 102. The opening 130 may be connected to the storage container 102 by a duct 132. As shown in FIG. 4, the duct 132 is connected to a corresponding opening 134 in the storage container 102. Air in the storage container 102, which is cooled by the HVAC unit 110, passes through the opening 134, the duct 132, and the opening 130, to flow into the housing 124, and air in the housing 124 passes through the opening 130, the duct 132, and the opening 134 to the storage container 102.

With reference to FIG. 5, the pump-motor assembly 118 is shown with the access panel 126 removed. The housing 124 may also include one or more baffles 136 that direct heat generated by the pump-motor 128 toward the opening 130, to ensure that the heat does not recirculate through the housing 124. The pump-motor 128 is shown on a floor 138 of the housing 116, with a baffle 136 as a horizontal shelf located above the pump-motor 128. FIGS. 6 to 8 show various arrangements of baffles 136 located in the duct 132. The baffles 136 may be movable, for example, to regulate the amount of diffusion of heat in the housing 124, with respect to any of the arrangements shown in FIGS. 5-8. In FIG. 6, the baffle 136 is a baseline baffle, extending vertically from the floor 138 of the housing 124, and extending from a side of the opening 130 in the housing 124. In FIG. 7, the baffle 136 is a horizontal baffle that extends horizontally from a side wall 140 of the duct 132. In FIG. 8, the baffle 136 is an inclined baffle, extending from the side wall 140 of the duct 132, and angled toward the pump-motor 128 at an angle θ relative to a horizontal plane extending through the duct 132. That is, from an end of the baffle 136 adjacent to the storage container 102 to an end of the baffle 136 adjacent to the housing 124, the baffle 136 is angled downward at the angle θ, which may be, for example, between 30° and 60°. The position of the baffle 136 in either one of FIG. 7 or 8 may be chosen based on a height of the pump-motor 128. That is, the baffle 136 may be positioned so that an end of the baffle 136 closest to the pump-motor 128 is above the pump-motor 128, to ensure circulation of hot air near the pump-motor 128 toward the storage container 102.

Figure 9:
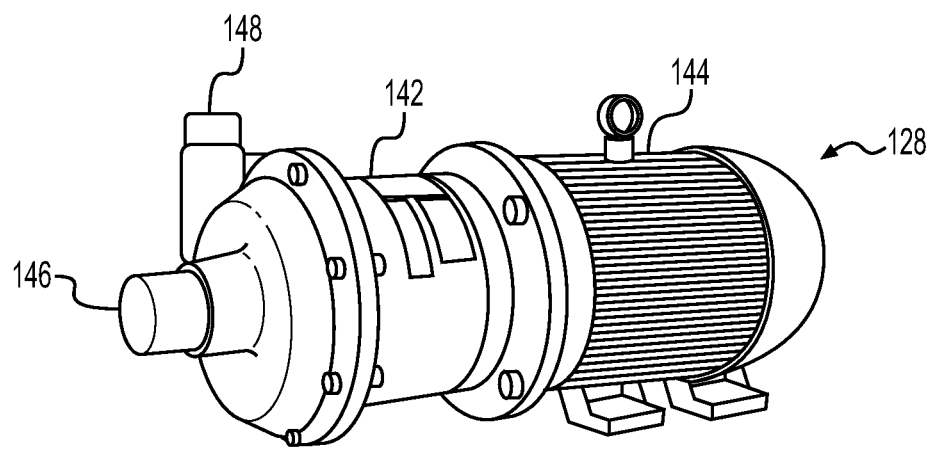
FIG. 9 shows a schematic view of a pump-motor of the pump-motor assembly shown in FIGS. 1, 3, and 5.

With reference to FIG. 9, the pump-motor 128 includes a pump 142, which may be, for example, a dynamic pump, e.g., a centrifugal pump, with a fan (not shown) that blows air towards and cools windings (not shown) of a motor 144. The pump 142 may, however, be another type of pump, such as a positive displacement pump, e.g., a reciprocating type or a rotary type pump. The pump 142 and the motor 144 may be coupled by a magnetic drive. The motor 144 provides power to the pump 142 and, in particular, to an impeller (not shown) of the pump 142. The motor 144 may be, for example, a totally enclosed fan cooled (TEFC) motor. The pump-motor 128 maintains a liquid coolant in the coolant system 118 at a minimum pressure of 350 kPA. The pump-motor 128 is connected to the cooling system 122 via an inlet 146 and an outlet 148, shown schematically in FIG. 2. The pump-motor assembly 114 also includes one or more drain ports 150 provided through the floor 138 of the housing 120, as shown in FIGS. 2 and 5. The drain ports 150 may be an opening in the floor 138 of the housing 124, each of which can be closed using a nut, for example, and opened for draining of fluid from the housing 124.

INDUSTRIAL APPLICABILITY

The battery storage system 100, and, in particular, the pump-motor assembly 118 of the present disclosure provides for efficient cooling of battery storage 104, to maintain the batteries 108 stored in the energy storage unit 104 within an operating temperature range, for a wide range of ambient temperatures. In particular, the pump-motor assembly 118 is located outside of the storage container 102, in the relatively small, enclosed, insulated housing 124, which reduces a load on the HVAC unit 110 of the battery storage system 100, as compared to pump-motor assemblies located within the storage container 102 or within relatively larger enclosures. Providing openings, namely, the opening 130 in the housing 124 and the opening 134 in the storage container 102, connected by the duct 132, allows for air in the storage container 102 that is cooled by the HVAC unit 110 to flow into the housing 124, and air in the housing 124, which is heated due to operation of the pump-motor 128, to flow into the storage container 102. Placement of the pump-motor 128 in the enclosed, insulated housing 124 protects the motor 144 of the pump-motor 128 from condensation building up on the windings as a result of high ambient temperatures and humidity, as well as from sand and debris. The relatively small size of the housing 124 of the pump-motor assembly 118 costs less than relatively larger housings. Further, providing the access panel 126 to the housing 124 provides for easy access for maintenance and servicing of the pump 142 and the motor 144.

When the pump-motor assembly 118 is in use, the pump-motor 128 is powered on and the pump 142 circulates the coolant through the cooling system 122, shown in FIG. 2. As shown in FIG. 2, the coolant flows from the pump 142 to the battery storage 104 to cool the batteries 108. That is, the pump 142 supplies the coolant to the batteries 108 in the battery storage 104. The batteries 108 may be, for example, lithium ion batteries which must be maintained at a temperature in a range of 10° C. to 30° C. for optimal performance and life of the batteries 108. The coolant absorbs heat generated by the batteries 108. Then, the coolant flows to the chiller 120, which cools the coolant. From the chiller 120, the coolant returns to the pump 142. A majority of the cooling system 122 is located within the storage container 102, and, therefore, is not exposed to ambient temperatures outside of the storage container 102, thus improving the efficiency of the system.

The fan cooled motor 144 of the pump-motor assembly 118 circulates hot air generated by the motor 144 into the air conditioned storage container 102 via the opening 130, the duct 132, and the opening 134. The pump-motor assembly 118 thus draws cooled air from the storage container 102 to cool air within the housing 124. By this arrangement, the HVAC unit 110 in the energy storage container 102 rejects, or transfers and removes, the heat generated by the motor 144. Air temperature within the storage container 102 may fluctuate or vary due to neat from the pump-motor 125 and the power electronics cabinet 106, and, therefore, the HVAC unit 110 manages the air temperature within the storage container 102 below about 25° C. to maintain operability of these and other elements. Air temperature within the power electronics cabinet 106 may fluctuate or vary due to hot or cold ambient air outside of the storage container, and heat from devices such as power electronics and other electrical equipment. Because the HVAC unit 110 maintains air temperature in the storage container 102 at around 25° C., a readily available, commoditized pump-motor can be used, without the need for more expensive, specialty pumps suited for extreme temperatures, for example. The relatively small size of the housing 124 of the pump-motor assembly 118 results in a small increase in load on the HVAC unit 110. The relatively small size of the housing 124 also reduces costs of material used to form the housing 124, and the costs of insulation for same. And, as noted above, the enclosed, insulated housing 124 restricts ambient air from entering the housing 124, while cool air from the storage container 102 circulates through the housing 124, thus preventing condensate from forming on the motor 144. In addition, the drain ports 150 provided in the floor 138 of the housing 124 allow for management of leaks, and, because the pump-motor assembly 118 is not located in the storage container 102, any such leaks are prevented from occurring in the storage container 102, which could damage the battery storage 104 and the power electronics cabinet 116. The removable access panel 126 allows for ease of maintenance and servicing of the pump 142 and the motor 144 from outside of the storage container 102, and without the need to enter the storage container 102.

By virtue of the pump-motor assembly of the present disclosure, lower cost pump-motors may be used, such as TEFC pumps, or outdoor duty pumps, without the need for specialty pumps, e.g., arctic duty pumps. In addition, by virtue of the pump-motor assembly being located in a relatively small, sealed, insulated enclosure adjacent to the storage container, efficient management of condensate and ventilation of the pump-motor assembly is possible, with a negligible increase in load on the HVAC unit, and with reduced costs for forming the insulated, enclosed housing of the pump-motor assembly.

It will be apparent to those skilled in the art that various modifications and variations can be made to the disclosed pump-motor assembly without departing from the scope of the disclosure. Other embodiments of the pump-motor assembly will be apparent to those skilled in the art from consideration of the specification and the accompanying figures. It is intended that the specification, and, in particular, the examples provided herein be considered as exemplary only, with a true scope of the disclosure being indicated by the following claims and their equivalents.

We claim:

1. A pump-motor assembly provided outside of and adjacent to a storage container that stores a back-up energy storage unit, the pump-motor assembly comprising:
   a pump-motor that maintains a minimum pressure of a liquid coolant in a liquid coolant system that cools the back-up energy storage unit; and
   a housing that is completely enclosed, the housing containing the pump-motor, and having a removable access panel on one side thereof, and an opening on another side thereof to the storage container,
   wherein the housing is configured to receive air cooled by a heating, ventilation, and air conditioning (HVAC) unit in the storage container through the opening to the storage container.

2. The pump-motor assembly of claim 1, wherein the opening of the housing connects to an opening of the storage container by a duct.

3. The pump-motor assembly of claim 2, wherein one or more baffles are provided in one of the housing and the duct, to direct hot air out of the housing and into the storage container.

4. The pump-motor assembly of claim 3, wherein a baffle of the one or more baffles is a baseline baffle extending from a floor of the housing.

5. The pump-motor assembly of claim 3, wherein a baffle of the one or more baffles is a horizontal baffle extending from a side wall of the duct.

6. The pump-motor assembly of claim 3, wherein a baffle of the one or more baffles is an inclined baffle that is inclined at an angle relative to a horizontal plane.

7. The pump-motor assembly of claim 1, wherein the housing includes an openable drain port in a floor thereof.

8. An energy storage system, comprising:
a storage container that stores a back-up energy storage unit, the back-up energy storage unit including one or more energy sources;
a heating, ventilation, and air conditioning (HVAC) unit provided in the storage container to cool air in the storage container;
a liquid cooling system that cools the back-up energy storage unit; and
a pump-motor assembly provided outside of the storage container, the pump-motor assembly comprising:
a pump-motor that circulates a liquid coolant in the liquid coolant system at a minimum pressure; and
a housing that is completely enclosed, the housing containing the pump-motor, and having an opening on one side thereof that connects to an opening in the storage container.

9. The energy storage system of claim 8, wherein the housing is configured to receive air cooled by the HVAC unit from the storage container through the opening to the storage container.

10. The energy storage system of claim 8, wherein the opening of the storage container and the opening of the housing are connected by a duct.

11. The energy storage system of claim 10, wherein one or more baffles are provided in one of the housing and the duct, to direct hot air out of the housing and into the storage container.

12. The energy storage system of claim 11, wherein a baffle of the one or more baffles is a baseline baffle extending from a floor of the housing.

13. The energy storage system of claim 11, wherein a baffle of the one or more baffles is a horizontal baffle extending from a side wall of the duct.

14. The energy storage system of claim 11, wherein a baffle of the one or more baffles is an inclined baffle that is inclined at an angle relative to a horizontal plane.

15. The energy storage system of claim 8, wherein the housing includes an openable drain port in a floor thereof.

16. The energy storage system of claim 8, wherein the housing includes a removable access panel on another side thereof.

17. The energy storage system of claim 8, wherein the HVAC unit maintains a temperature of air in the storage container below 25° C.

18. An energy storage system, comprising:
a back-up energy storage unit, including one or more energy sources;
a storage container that stores the back-up energy storage unit;
a heating, ventilation, and air conditioning (HVAC) unit that cools air in the storage container;
a liquid cooling system that cools the one or more energy sources of the back-up energy storage unit;
a pump-motor provided outside of the storage container, the pump-motor being connected to the liquid cooling system and maintaining a minimum pressure of a liquid coolant in the liquid coolant system; and
a housing containing the pump-motor, the housing being sealed from ambient air, and having a removable access panel on one side thereof, and an opening on another side thereof that connects to an opening in the storage container, wherein cool air from the storage container flows into the housing, and hot air from the housing flows into the storage container.

19. The energy storage system of claim 18, wherein the opening of the storage container and the opening of the housing are connected by a duct having one or more baffles to direct hot air out of the housing and into the storage container.

20. The energy storage system of claim 18, wherein the HVAC unit maintains a temperature of air in the storage container below 25° C.

* * * * *